US010559710B2

(12) United States Patent
Runstadler, Jr. et al.

(10) Patent No.: US 10,559,710 B2
(45) Date of Patent: Feb. 11, 2020

(54) SYSTEM OF HEIGHT AND ALIGNMENT ROLLERS FOR PRECISE ALIGNMENT OF WAFERS FOR ION IMPLANTATION

(71) Applicant: Intevac, Inc., Santa Clara, CA (US)

(72) Inventors: William Eugene Runstadler, Jr., Livermore, CA (US); Babak Adibi, Los Altos, CA (US); Terry Bluck, Santa Clara, CA (US)

(73) Assignee: INTEVAC, INC., Santa Clara, CA (US)

(*) Notice: Subject to any disclaimer, the term of this patent is extended or adjusted under 35 U.S.C. 154(b) by 13 days.

(21) Appl. No.: 16/040,423

(22) Filed: Jul. 19, 2018

(65) Prior Publication Data

US 2019/0027636 A1    Jan. 24, 2019

Related U.S. Application Data

(60) Provisional application No. 62/534,345, filed on Jul. 19, 2017.

(51) Int. Cl.
| | | |
|---|---|---|
| *H01J 37/20* | (2006.01) | |
| *H01J 37/18* | (2006.01) | |
| *H01J 37/317* | (2006.01) | |
| *H01L 31/18* | (2006.01) | |

(52) U.S. Cl.
CPC ........ *H01L 31/1876* (2013.01); *H01J 37/185* (2013.01); *H01J 2237/202* (2013.01); *H01J 2237/2007* (2013.01)

(58) Field of Classification Search
CPC ......... H01J 2237/2007; H01J 2237/202; H01J 2237/204; H01J 2237/31701; H01J 2237/31711; H01J 37/185; H01J 37/20; H01J 37/3045; H01J 37/3171; H01L 31/1876; H01L 31/0203
USPC ...................................... 250/453.11; 414/788
See application file for complete search history.

(56) References Cited

U.S. PATENT DOCUMENTS

| | | | | |
|---|---|---|---|---|
| 7,717,661 | B1 * | 5/2010 | Aho ...................... | H01L 21/681 250/559.3 |
| 8,174,229 | B2 * | 5/2012 | Fujita ..................... | H01J 37/20 318/594 |
| 8,957,395 | B2 * | 2/2015 | Peijster ................... | H01J 37/20 250/453.11 |
| 9,030,649 | B2 * | 5/2015 | Peijster .................. | G03B 27/58 355/72 |
| 9,082,799 | B2 * | 7/2015 | Weaver ................. | C23C 14/042 |

(Continued)

*Primary Examiner* — Gregory W Adams
(74) *Attorney, Agent, or Firm* — Womble Bond Dickinson (US) LLP; Joseph Bach, Esq.

(57) ABSTRACT

A system for transporting substrates and precisely alignment the substrates to shadow masks. The system decouples the functions of transporting the substrates, vertically aligning the substrates, and horizontally aligning the substrates. The transport system includes a carriage upon which plurality of pedestals are loosely positioned, each of the pedestals includes a base having vertical alignment wheels to place the substrate in precise vertical alignment. Two sidebars are configured to freely slide on the base. Each of the sidebars includes a set of horizontal alignment wheels that precisely align the substrate in the horizontal direction. Substrate support claws are attached to the sidebars in precise alignment to the vertical alignment wheels and the horizontal alignment wheels.

20 Claims, 4 Drawing Sheets

(56) References Cited

U.S. PATENT DOCUMENTS

| | | | |
|---|---|---|---|
| 9,324,598 B2* | 4/2016 | Pederson | H01L 21/67745 |
| 9,368,320 B2* | 6/2016 | Nishioka | H01J 37/20 |
| 9,543,114 B2* | 1/2017 | Adibi | H01J 37/185 |
| 2015/0248991 A1* | 9/2015 | Ogawa | H01J 37/20 |
| | | | 250/491.1 |
| 2016/0042913 A1* | 2/2016 | Adibi | H01J 37/185 |
| | | | 250/453.11 |
| 2019/0027635 A1* | 1/2019 | Vu | H01L 31/1876 |

* cited by examiner

SYSTEM OF HEIGHT AND ALIGNMENT ROLLERS FOR PRECISE ALIGNMENT OF WAFERS FOR ION IMPLANTATION

CROSS-REFERENCE TO RELATED APPLICATION

This application claims priority from U.S. Provisional Applications No. 62/534,345, filed Jul. 19, 2017, the disclosure of which is incorporated herein by reference in its entirety.

BACKGROUND

1. Field

This disclosure relates generally to alignment of wafers in semiconductor fabrication. Disclosed embodiments are particularly useful in the field of solar cell fabrication and, specifically, for fabrication of selective emitter solar cells using ion implant process.

2. Related Art

Selective-Emitter solar cells are well known in the art. The advantages of a selective-emitter solar cell include a low contact resistance due to heavy doping underneath the metal grid, improved front-surface passivation of the lightly doped region between the grid, and reduced recombination under the metal contact.

Selective emitter solar cells have highly doped lines under the metal fingers. Generally this is done by forming a mask directly on the surface of the cell and etching the pattern of the doped lines. An example for such a process is disclosed in U.S. Pat. No. 9,853,178. However, it is also known that doping profile can be better controlled by using ion implant. Improved doping profile can provide enhanced cell efficiency. However, traditionally ion implant process is also performed using mask formed directly on the substrate with an etched circuitry, making such a process prohibitively expensive for solar cell fabrication.

The use of a "shadow mask" which is placed above the substrate can be attractive for ion implanting for selective emitter solar cells. However, the difficulty with shadow mask is proper alignment of each consecutive substrate in a commercially viable production environment. The preference is to align each wafer separately to a corresponding mask. Therefore, one solution has been to place the shadow mask directly on the wafer and transport the wafer and the masks together. However, such solution requires mechanisms to properly place the masks onto the wafer in proper alignment. Also, as the masks travel through the system, it requires cleaning, which adds processing time and cost.

Applicant has previously disclosed a system enabling alignment of substrates for ion implant process in U.S. Pat. No. 9,543,114. In that system the mask need not be placed on top on the wafer. However, that system enables processing one wafer at a time. Accordingly, a need exists in the art for improved alignment of shadow masks for performing ion implant of selective emitter solar cells. Preferably, the alignment can be done for a plurality of wafers simultaneously.

SUMMARY OF THE INVENTION

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed embodiments enable processing a substrate using one or more masks, all precisely aligned to the substrate. This enables generating multiple patterns on the substrates, all inter-aligned.

In disclosed embodiments, the operations of transporting of the substrates, the vertical alignment to the mask, and the horizontal alignment to the mask are all decoupled from each other. Such decoupling reduces the cost of the transport system, as it need not have tolerances corresponding to the alignment to the masks. Decoupling the vertical and horizontal alignment enables precise alignment of multiple wafers simultaneously and repeatedly.

According to disclosed embodiments, the substrate holder need not be precisely oriented throughout its transport through the system. Rather, in each processing station, an alignment mechanism is provided that ensures precise vertical and horizontal orientation of the holder, such that the substrate is precisely aligned to the mask. It should be understood that the reference to "masks" in this context is to a mask that is made of a thin sheet, e.g., thin metal sheet, sometimes referred to as a shadow mask.

In the disclosed embodiments, a system for transporting substrates in a processing system comprises: a carriage configured for supporting and transporting a plurality of pedestals; a plurality of pedestals positioned loosely on the carriage, each of the pedestals comprising: two sets of vertical height control rollers positioned in opposing orientation to each other and configured to control vertical position of the pedestal; two sets of vertical horizontal control rollers positioned in opposing orientation to each other and configured to control horizontal position of the pedestal; and a plurality of claws configured to hold a substrate in precise alignment to the vertical control rollers and the horizontal control rollers.

In general aspects, a system for transporting substrates in a processing system comprises a carriage upon which a plurality of pedestals are loosely positioned, wherein each of the pedestals is configured to hold a single substrate and includes a base having vertical alignment wheels configured to place the substrate in precise vertical alignment, each pedestal further includes two sidebars configured to freely slide on the base, a set of horizontal alignment wheels is attached to each sidebar and is configured to precisely align the substrate in horizontal direction, substrate support claws are attached to the sidebars in precise alignment to the vertical alignment wheels and the horizontal alignment wheels.

According to further aspects, a system for transporting substrates in a processing system comprises: a carriage upon which a plurality of pedestals are loosely positioned, the carriage configured for transporting the plurality of pedestals in a processing system and under a plurality of shadow masks; wherein each of the pedestals is configured to hold a single substrate and comprises: a base having vertical alignment wheels configured to place the base in precise vertical alignment to one of the shadow masks; two sidebars configured to freely slide on the base; a set of horizontal alignment wheels attached to each sidebar and configured to precisely align each of the sidebars in horizontal direction to one of the shadow masks; and, a substrate support claws attached to the sidebars in precise alignment to the vertical alignment wheels and the horizontal alignment wheels.

According to disclosed aspects, each of the pedestals may further comprise a base, wherein the two sets of vertical height control rollers are attached to the base; and two side bars slidably positioned on top of the base and wherein the two sets of horizontal control rollers are attached to the two sidebars. The embodiments may further include vertical urging mechanism urging each of the pedestals vertically upwards from the carriage, and horizontal urging mechanism urging the two side bars in a direction perpendicular to direction of travel of the carriage.

Disclosed embodiments may include a plurality of shadow masks; a plurality of tracks positioned in precise alignment to the shadow masks; wherein the two sets of vertical height control rollers and the two sets of horizontal control rollers are configured to engage the tracks to thereby align the substrates to the shadow masks. Also, each of the plurality of tracks may comprise a vertical alignment wall and a horizontal alignment wall; and wherein the two sets of vertical height control rollers are configured to engage the horizontal alignment wall and the two sets of vertical horizontal control rollers are configured to engage the horizontal alignment wall.

Other aspects include an ion implant system having and ion source generating an ion beam; a plurality of masks positioned on tracks in the flight path of the ion beam, each of the masks being aligned to respective tracks; a carriage configured to transport a plurality of pedestals under the masks; a plurality of pedestals positioned on the carriage, each of the pedestals having a first means to align the pedestal vertically to the tracks and a second means, operating independently of the first means, to align the pedestal horizontally to the tracks, in a direction perpendicular to the direction of travel. In these embodiments, the first means may be two sets of vertical height control rollers and the second means may be two sets of horizontal control rollers. In these embodiments, each of the pedestals may be configured to hold a single substrate and comprises: a base having vertical alignment wheels configured to place the base in precise vertical alignment to one of the shadow masks; two sidebars configured to freely slide on the base; a set of horizontal alignment wheels attached to each sidebar and configured to precisely align each of the sidebars in horizontal direction to one of the shadow masks; and, a substrate support claws attached to the sidebars in precise alignment to the vertical alignment wheels and the horizontal alignment wheels.

BRIEF DESCRIPTION OF THE DRAWINGS

Other aspects and features of the invention would be apparent from the detailed description, which is made with reference to the following drawings. It should be appreciated that the detailed description and the drawings provides various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1A illustrates an arrangement for processing an array of substrates simultaneously, while FIG. 1B illustrates the carriage, according to one embodiment of the invention.

DETAILED DESCRIPTION

Embodiments of the inventive substrate alignment mechanism and its implementation in the manufacture of solar cells will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

The following embodiment enables the use of a simple and inexpensive carriage, which is configured to transport an array of wafers throughout the processing system. The carriage is simple and inexpensive as it need not have the same alignment tolerances as required by the wafer alignment to the shadow mask. Rather, at the processing station a mechanism is provided to align each wafer individually to its corresponding mask. Moreover, the vertical and horizontal alignments are decoupled.

Figures 1A, 1B:
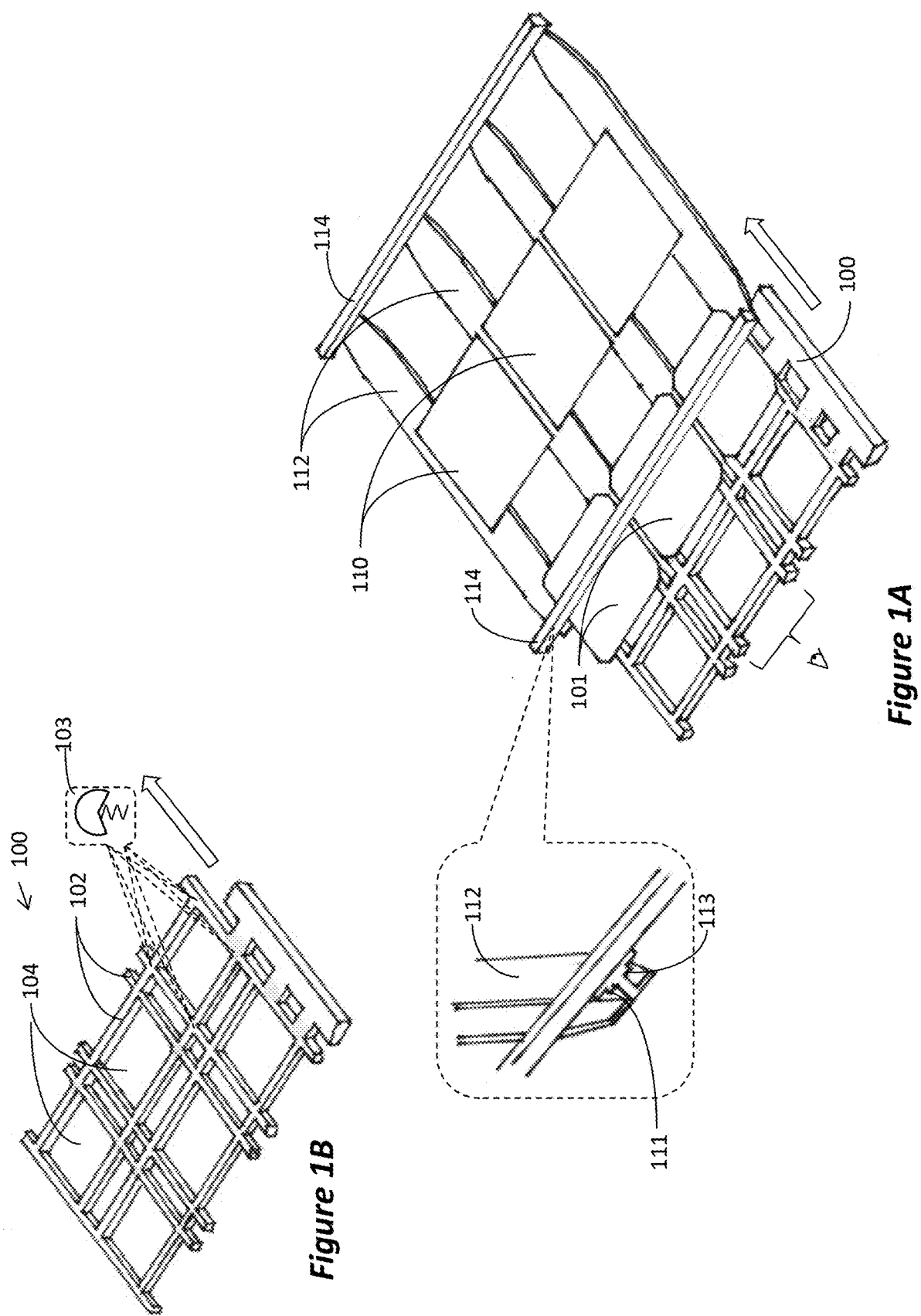

FIG. 1A illustrates a general view of elements of the system which support the individual alignment of the substrates to the masks. All other elements of the systems are not shown, so as not to obscure the relevant elements. The embodiment illustrated in FIG. 1A is particularly beneficial for ion implant fabrication of selective emitted solar cells, such that the system include ion source, ion extraction and beam forming elements, etc., which are not shown in FIG. 1. Also, while the carriage shown in FIG. 1A is configured to support an array of two by three wafers, the carrier is shown with only three wafers and no wafers or pedestals positioned on the remaining three slots, only to allow the reader to better see the elements of the system.

The objective of the elements of FIG. 1A is to precisely and reproducibly align substrates 101 positioned on pedestals 105 (shown in FIG. 2) to masks 110. This arrangement can be used for stationary implant (wherein the substrates do not move during the implant process) or for a pass-by implant (wherein the substrates move under the masks during the implant process). In either case, each of the substrates 101 is precisely aligned under the respective mask 110 (e.g., a thin sheet of stainless steel having cutouts for desired implant pattern).

In FIG. 1A, a carriage 100 is configured to house and transport an array of m×n pedestals 105, wherein each pedestal is configured to support one substrate. In the illustrated embodiment the array is of 3×2 pedestals, i.e., m=3 and n=2, wherein three substrates are positioned abreast of each other and are processed simultaneously under three masks 110. The pedestals are positioned on the carriage 100 rather loosely, such that each may move to a certain extent in translation and elevation.

The carriage 100 utilized in the embodiment of FIG. 1A is illustrated in FIG. 1B. As shown, the carriage 100 is constructed simply of a grid of crisscross bars 102. The bars 102 form seats 104 over each of which one pedestal 105 is loosely positioned. As shown by the dash-line callout in FIG. 1B, an urging mechanism 103, such as a spring-loaded rod, is provided at each corner of each seat 104. Each pedestal 105 is positioned over the four urging mechanisms 103, such that each pedestal 105 is urged upward vertically. Alternatively, the urging mechanism may be attached to the pedestal 105 itself, and urge against the bars 102.

The masks 110 are positioned with accurate alignment with respect to tracks (three shown), each track being defined by two opposing rails 112 attached to cross members 114. That is, each of the masks is individually aligned with respect to straight edge of a corresponding rail 112. As shown in the dash-line callout of FIG. 1A, each rail 112 has a vertical alignment wall 111 and a horizontal alignment wall 113. Each of the masks 110 is positioned with precise alignment with respect to a corresponding vertical alignment wall 111 and a horizontal alignment wall 113. The carriage 100 moves in the direction shown by the arrow, such that it brings each of the substrates under its respective mask. As will be described later, each pedestal is then positioned with precise alignment to the vertical alignment wall 111 and a horizontal alignment wall 113. The wafer is consequently precisely aligned to the corresponding mask in the vertical and horizontal directions.

Figure 2:
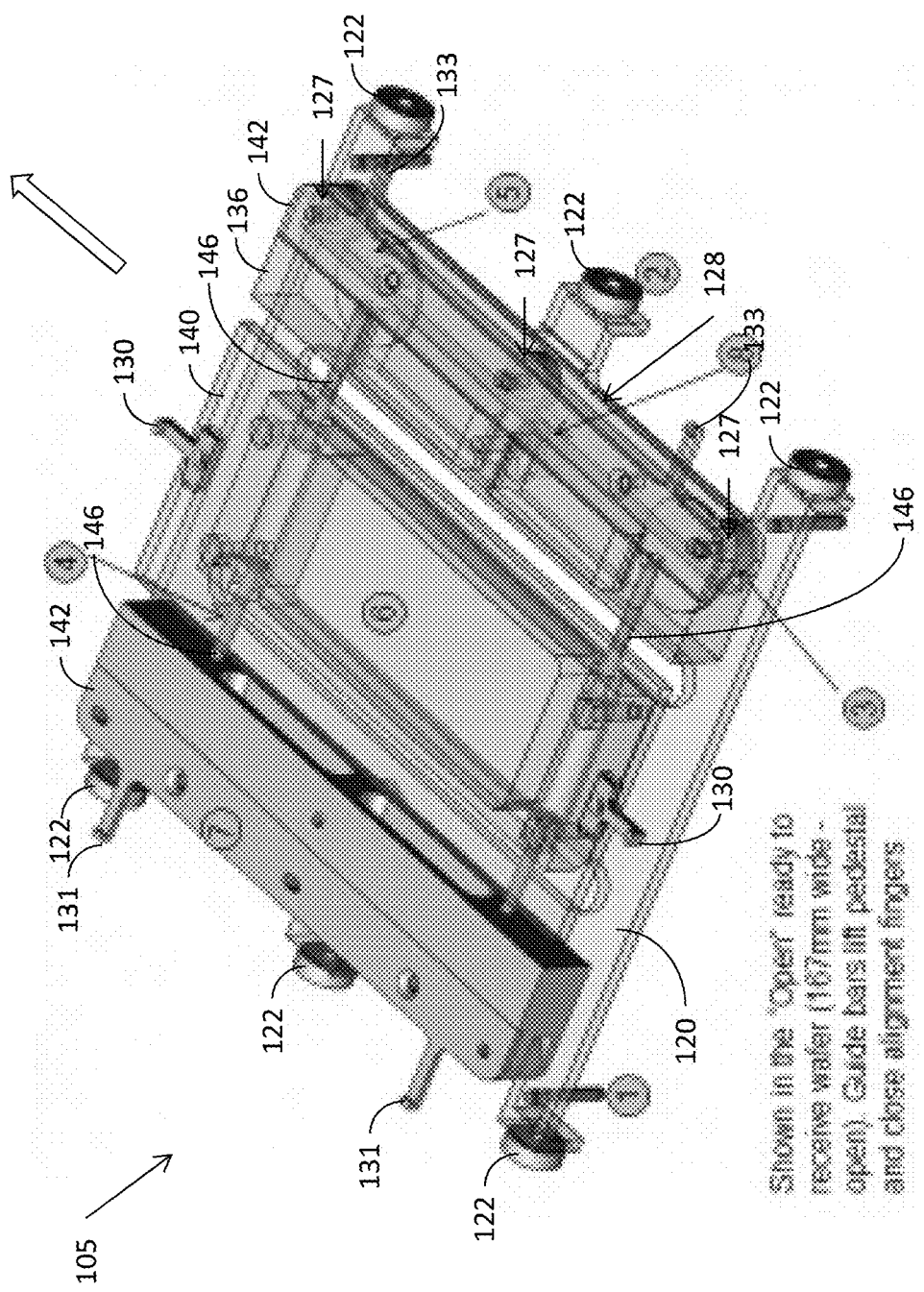
FIG. 2 illustrates one of the pedestals shown in the array of FIG. 1A.

FIG. 2 illustrates one of the pedestals 105 in more details. Each of the pedestals 105 is configured to hold one substrate in precise alignment to vertical and horizontal alignment wheels. The pedestal 105 has a base 120, having vertical height control rollers 122. In the example illustrated, the base 120 is shown with three vertical height control rollers 122 on each side, for a total of six rollers 122, forming two opposing sets of rollers. The rollers 122 are configured to engage the horizontal walls 113 of tracks 112, so as to position the substrate at a precise distance below the respective mask 110. Since ion beams tend to expand over the line of flight, it is important to maintain the designed distance precisely, as it affects the width of the implanted lines. As the urging mechanism 103 urges the pedestal 105 upwards, the vertical height control rollers 122 engage the horizontal walls 113 of tracks 112, to place the wafer at precise distance from the mask (recall that the mask itself is positioned with precise alignment to the horizontal wall 113 as well).

The base 120 is configured to only align the wafer vertically to the mask. Horizontal, i.e., sidewise alignment is done independently of the vertical alignment of the base. Specifically, central block 140 is attached to the base 120 and has claws 130, which hold the wafer in horizontal position in the direction of travel (shown by the arrow), mainly to prevent the wafer from falling off during travel of the carriage. The horizontal alignment in the direction of travel need not be aligned precisely.

Two side blocks 142 are positioned over the base 120. Each of the side blocks 142 is made to slide over the base 120, e.g., by use of low friction slide pads (obscured) attached to the bottom of the blocks 142. Each block also slides on rods 146, each of which is also spring-loaded and urge the respective block in a direction away from the central block 140. This position would be referred to herein as the open position. In the open position both blocks 142 are urged away from the central block 140, such that a wafer can be removed or loaded. When loaded, the wafer is held by claws 130 of the central block 140 and by claws 131 and 133 of the side blocks 142.

Each of the side blocks 142 also has three horizontal control rollers 127. The horizontal control rollers 127 are configured to engage the vertical walls 111 of tracks 112. The inside edge of each claw, i.e., the edge that engages the wafer, is positioned in precise distance to the shaft of the respective roller 127. When the carriage places the pedestal in the tracks 112, the side blocks are urged by the spring-loaded rods 146 so as to urge the horizontal control rollers 127 against the vertical walls 111. Since the side blocks slide freely over the base 120, the engagement of the horizontal control rollers 127 against the vertical wall 111 moves the side blocks into precise horizontal (side-to-side) alignment with the straight edge of the vertical wall 111 of the tracks 112. This movement precisely aligns the substrates to the masks in the direction orthogonal to the direction of travel of the carriage 100, and thus orthogonal to the direction of travel of the substrate. Thus, the rollers on the base align the wafer vertically, while the rollers on the side blocks align the wafer horizontally, in a decoupled manner.

Figure 3:
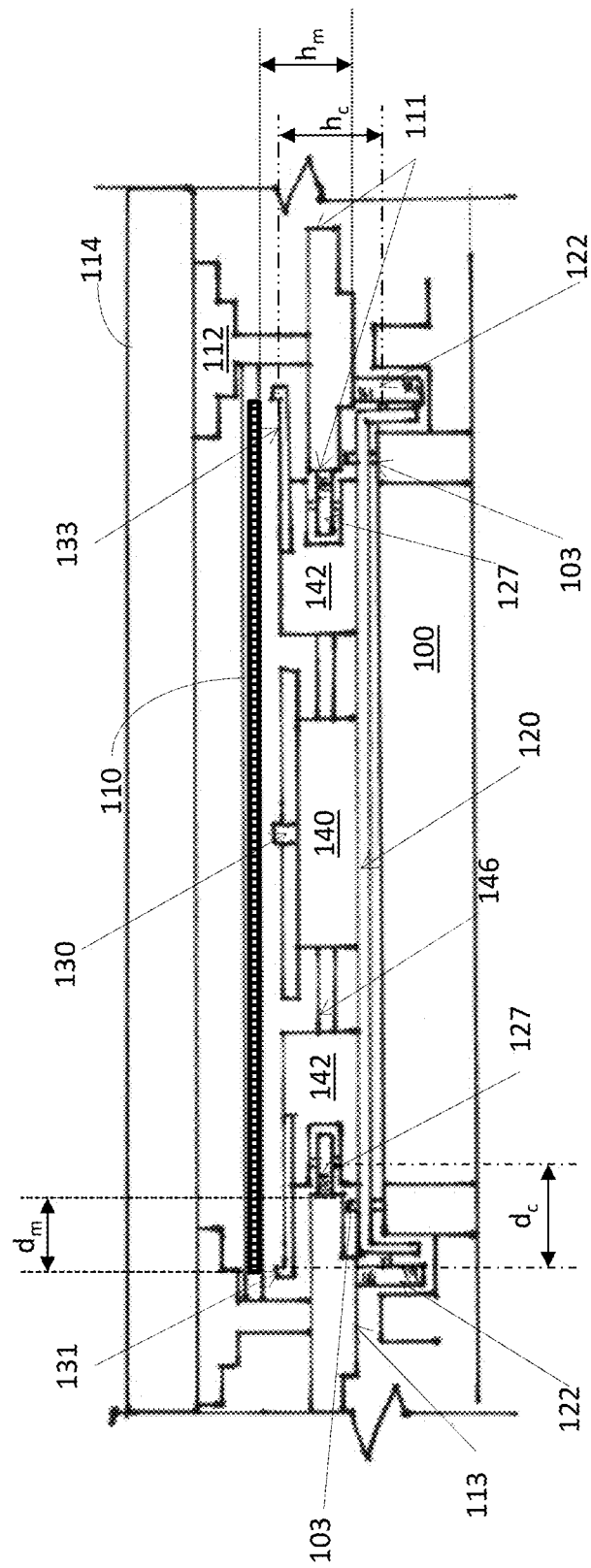
FIG. 3 illustrates a side view of one pedestal shown in the array of FIG. 1A.

FIG. 3 illustrates a partial side view from the direction exemplified by the eye cartoon in FIG. 1A. The drawing of FIG. 3 shows only one pedestal 105 and also omits the wafer from the pedestal for clarity. The direction of travel in FIG. 3 is into the page. The pedestal is placed on top of the carriage 100 and is loosely held and urged upwards by urging mechanism 103, in this example being four spring loaded rods engaging base 120. As the carriage 100 transports the pedestal 105 into the tracks 112, vertical height control rollers 122 of base 120 engage the horizontal walls 113, such that the base moves vertically, if needed, thereby placing the top surface of the claws 131 and 133 at precise distance to the bottom surface of the mask 110. Specifically, the carrier is constructed such that a precise distance $h_e$ is maintained between the top surface of claws 131 and 133 and the vertical height control rollers 122. Similarly, the mask and tracks 112 are constructed so as to maintain a precise distance $h_m$ between the bottom surface of the mask and the horizontal walls 113 of the track 112. Since the vertical height control rollers 122 are urged against the horizontal walls 113, the top surface of the claws 131 and 133, and hence the wafer, are placed at precise distance to the bottom surface of the mask.

Meanwhile, in the horizontal direction the alignment is done as follows. The pedestal 105 is constructed such that a precise distance $d_c$ is maintained between the edge of claws 131 and 133 and the respective horizontal control rollers 127. The horizontal control rollers 127 are attached to side blocks 142, which freely slide on top of the base 120, and are urged open by the spring-loaded rods 146. The edge of the mask 110 is constructed so as to maintain precise distance $d_m$ to the vertical alignment wall 111. Consequently, when the carriage 100 transports the pedestal 105 onto the tracks 112, the horizontal control rollers 127 are urged against the vertical alignment wall 111, thus placing the wafer in precise horizontal alignment with the mask 110.

Thus, as can be seen from the above description, the three functions of transporting the wafer, aligning the wafer vertically to the mask, and aligning the wafer horizontally to the mask are totally decoupled and are performed by different elements of the system. This permits the construction of a relatively simple and inexpensive transport carriage. It also permits relaxing of the tolerances for most parts of the system, leading to a reduced cost. As long as the claws are precisely positioned with respect to the rollers and the mask is placed precisely with respect to the vertical and horizontal straight edges, the alignment of the wafers to the masks would be repeatable—regardless of the tolerances of any other the other parts of the system.

Figure 4B:
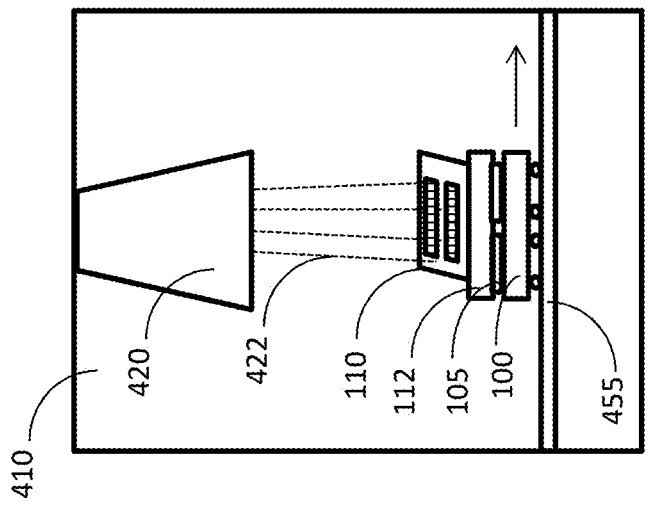
FIGS. 4A and 4B is a schematic illustrating an ion implant system according to one embodiment.
Figure 4A:
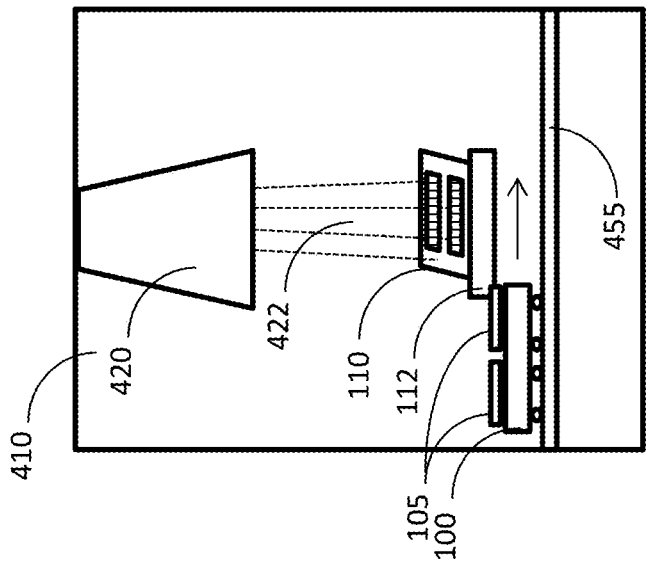

FIGS. 4A and 4B are schematics illustrating an ion implant system 410 according to one embodiment. In FIG. 4A the carriage 100 with the pedestals 105 approaches the ion implant stage, while in FIG. 4B the carriage 100 with the pedestals 105 is inside the ion implant stage, placing the pedestals 105 under the masks 110. Specifically, the ion implant stage is formed by an ion source 420, which generates an ion beam 422. Masks 110 with tracks 112 are positioned in the line of travel of the ion beam 422, such that they block part of the ion beam and only let through part of the beam according to the design of the masks 110.

Carrier 100 can travel over transport tracks 455 towards the ion implant stage. When the carriage 100 enters the ion implant stage, the pedestals 105 engage the tracks 112 so as to place the wafers in precise alignment to the masks 110. The wafers are then implanted with the ions that pass through the openings in the masks. The implant may be performed with the pedestals stationary under the masks, or with the pedestals in continuous travel under the masks, for a pass-by ion implant.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. A system for transporting substrates in a processing system, comprising:
   a carriage configured for supporting and transporting a plurality of pedestals;
   a plurality of pedestals positioned loosely on the carriage, each of the pedestals comprising:
      two sets of vertical height control rollers positioned in opposing orientation to each other and configured to control vertical position of the pedestal;
      two sets of horizontal alignment control rollers positioned in opposing orientation to each other and configured to control horizontal position of the pedestal;
      a plurality of claws configured to hold a substrate in precise alignment to the vertical control rollers and the horizontal control rollers.

2. The system of claim 1, wherein the carriage defines a plurality of seats, each seat configured for supporting one of the plurality of pedestals.

3. The system of claim 2, wherein each of the pedestals further comprises:
   a base, wherein the two sets of vertical height control rollers are attached to the base;
   two side bars slidably positioned on top of the base and wherein the two sets of horizontal control rollers are attached to the two sidebars.

4. The system of claim 3, further comprising a vertical urging mechanism urging each of the pedestals vertically upwards from the carriage.

5. The system of claim 4, wherein each of the pedestals further comprises horizontal urging mechanism urging the two side bars in a direction perpendicular to direction of travel of the carriage.

6. The system of claim 1, further comprising:
   a plurality of shadow masks;
   a plurality of tracks positioned in precise alignment to the shadow masks;
   wherein the two sets of vertical height control rollers and the two sets of horizontal control rollers are configured to engage the tracks to thereby align the substrates to the shadow masks.

7. The system of claim 6, wherein each of the plurality of tracks comprises a vertical alignment wall and a horizontal alignment wall; and wherein the two sets of vertical height control rollers are configured to engage the horizontal alignment wall and the two sets of vertical horizontal control rollers are configured to engage the horizontal alignment wall.

8. A system for transporting substrates in a processing system, comprising a carriage upon which a plurality of pedestals are loosely positioned, wherein each of the pedestals is configured to hold a single substrate and includes a base having vertical alignment wheels configured to place the substrate in precise vertical alignment, each pedestal further includes two sidebars configured to freely slide on the base, a set of horizontal alignment wheels is attached to each sidebar and is configured to precisely align the substrate in horizontal direction, substrate support claws are attached to the sidebars in precise alignment to the vertical alignment wheels and the horizontal alignment wheels.

9. The system of claim 8, wherein each of the pedestals further comprises a central block attached to the base and an urging mechanism configured to engage and urge each of the sidebars away from the central block.

10. The system of claim 9, further comprising vertical urging mechanism positioned between the carriage and each of the pedestals and configured to engage and urge each of the pedestals vertically away from the carriage.

11. The system of claim 9, further comprising sliding patches positioned between the carriage and the base of each of the pedestals.

12. The system of claim 10, further comprising sliding patches attached to bottom surface of the base of each of the pedestals.

13. The system of claim 10, wherein the vertical urging mechanism comprises a plurality of spring-loaded pins.

14. The system of claim 8, further comprising a plurality of shadow mask positioned over a plurality of tracks, each tracks comprising a vertical alignment straight edge and horizontal alignment straight edge.

15. The system of claim 14, wherein the carriage is configured to support a two-dimensional array of pedestals.

16. A system for transporting substrates in a processing system, comprising:
   a carriage upon which a plurality of pedestals are loosely positioned, the carriage configured for transporting the plurality of pedestals in a processing system and under a plurality of shadow masks;
   wherein each of the pedestals is configured to hold a single substrate and comprises:

a base having vertical alignment wheels configured to place the base in precise vertical alignment to one of the shadow masks;

two sidebars configured to freely slide on the base;

a set of horizontal alignment wheels attached to each sidebar and configured to precisely align each of the sidebars in horizontal direction to one of the shadow masks;

substrate support claws attached to the sidebars in precise alignment to the vertical alignment wheels and the horizontal alignment wheels.

17. The system of claim 16, further comprising a plurality of tracks, wherein the plurality of shadow masks are positioned in alignment to the tracks.

18. The system of claim 16, further comprising vertical urging mechanism positioned between the carriage and each of the pedestals and configured to engage and urge each of the pedestals vertically away from the carriage.

19. The system of claim 16, wherein each of the pedestals further comprises a central block attached to the base and an urging mechanism configured to engage and urge each of the sidebars away from the central block.

20. The system of claim 17, wherein each of the plurality of tracks comprises a vertical alignment wall and a horizontal alignment wall configured for engagement by the vertical alignment wheels and the horizontal alignment wheels.

* * * * *